United States Patent
Noguchi et al.

(10) Patent No.: US 11,183,261 B2
(45) Date of Patent: Nov. 23, 2021

(54) TEST DEVICE FOR MEMORY, METHOD FOR DETECTING HARDWARE FAILURE IN MEMORY DEVICE, AND TEST APPARATUS OF MEMORY ARRAY

(71) Applicant: Taiwan Semiconductor Manufacturing Co., Ltd., Hsinchu (TW)

(72) Inventors: Hiroki Noguchi, Hsinchu (TW); Ku-Feng Lin, New Taipei (TW); Yih Wang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 9 days.

(21) Appl. No.: 16/836,928

(22) Filed: Apr. 1, 2020

(65) Prior Publication Data
US 2021/0312999 A1    Oct. 7, 2021

(51) Int. Cl.
*G11C 29/00* (2006.01)
*G11C 29/38* (2006.01)
(Continued)

(52) U.S. Cl.
CPC .............. *G11C 29/38* (2013.01); *G11C 29/36* (2013.01); *G11C 11/16* (2013.01); *G11C 2029/3602* (2013.01)

(58) Field of Classification Search
None
See application file for complete search history.

(56) References Cited

U.S. PATENT DOCUMENTS 5,617,531 A * 4/1997 Crouch ............... G11C 29/006
                                                    714/10
5,706,234 A * 1/1998 Pilch, Jr. ............. G11C 29/34
                                                    365/189.07
(Continued)

OTHER PUBLICATIONS

V. A. Andrienko, M. Diaa, V. G. Ryabtsev and T. Y. Utkina, "Architecture of built-in self-test and recovery memory chips," East-West Design & Test Symposium (EWDTS 2013), 2013, pp. 1-12, doi: 10.1109/EWDTS.2013.6673185. (Year: 2013).*
(Continued)

*Primary Examiner* — Daniel F. McMahon
(74) *Attorney, Agent, or Firm* — JCIPRNET

(57) ABSTRACT

A testing device for memory includes a memory array and a test apparatus. The test apparatus includes a controller and a pattern generator. The pattern generator generates a background data, a first pattern data, and a second pattern data. The controller sets up the background data to a to-be-tested memory sub-array of the memory sub-arrays, performs a first memory test operation with the to-be-tested memory sub-array according to the first pattern data for detecting an occurrence of a hardware failure of the to-be-tested memory sub-array is occurred during the first memory test operation. The controller performs a second memory test operation with the to-be-tested memory sub-array according to the second pattern data for detecting the occurrence of the hardware failure of the to-be-tested memory sub-array during the second memory test operation in response to the hardware failure of the to-be-tested memory sub-array is not occurred during the first memory test operation.

20 Claims, 7 Drawing Sheets

(51) Int. Cl.
*G11C 29/36* (2006.01)
*G11C 11/16* (2006.01)

(56) References Cited

U.S. PATENT DOCUMENTS

| | | | | |
|---|---|---|---|---|
| 5,920,515 A * | 7/1999 | Shaik | ............... | G11C 29/844 |
| | | | | 365/200 |
| 6,467,056 B1 * | 10/2002 | Satou | ............... | G11C 29/16 |
| | | | | 714/720 |
| 6,829,181 B1 * | 12/2004 | Seitoh | ............... | G11C 29/38 |
| | | | | 365/201 |
| 2002/0138801 A1 * | 9/2002 | Wang | ............... | G01R 31/31705 |
| | | | | 714/729 |
| 2003/0101376 A1 * | 5/2003 | Sanghani | ............... | G11C 7/106 |
| | | | | 714/30 |
| 2004/0073839 A1 * | 4/2004 | Toros | ............... | G06F 11/27 |
| | | | | 714/30 |
| 2008/0046788 A1 * | 2/2008 | Lee | ............... | G11C 29/1201 |
| | | | | 714/718 |
| 2016/0155515 A1 * | 6/2016 | Son | ............... | G11C 29/4401 |
| | | | | 714/719 |
| 2018/0374555 A1 * | 12/2018 | Kwon | ............... | G11C 29/38 |

OTHER PUBLICATIONS

C. Selva et al., "A programmable built-in self-diagnosis for embedded SRAM," Records of the 2004 International Workshop on Memory Technology, Design and Testing, 2004., 2004, pp. 84-89, doi: 10.1109/MTDT.2004.1327989. (Year: 2004).*

* cited by examiner

TEST DEVICE FOR MEMORY, METHOD FOR DETECTING HARDWARE FAILURE IN MEMORY DEVICE, AND TEST APPARATUS OF MEMORY ARRAY

BACKGROUND

The present disclosure relates to a detection or a test technology for detecting hardware failure of a memory device with a memory array, and more particularly for a test device for memory, a method for detecting hardware failure in a memory device, and a test apparatus of a memory array.

Due to endurance and reliability of memory, a healthy hardware of the memory cells becomes failure for some reasons such as a damage or have been write or programmed repeatedly for a plurality of times because of endurance and reliability of the memory cells. The hardware failure may be affected by various faults, and most of the hardware failures are affected because of damaged memory cells themselves. If there are no corresponding hardware failure detection mechanisms are presented, so this mechanisms can be the development direction for MRAM or other non-volatile random-access memory.

BRIEF DESCRIPTION OF THE DRAWINGS

Aspects of the present disclosure best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
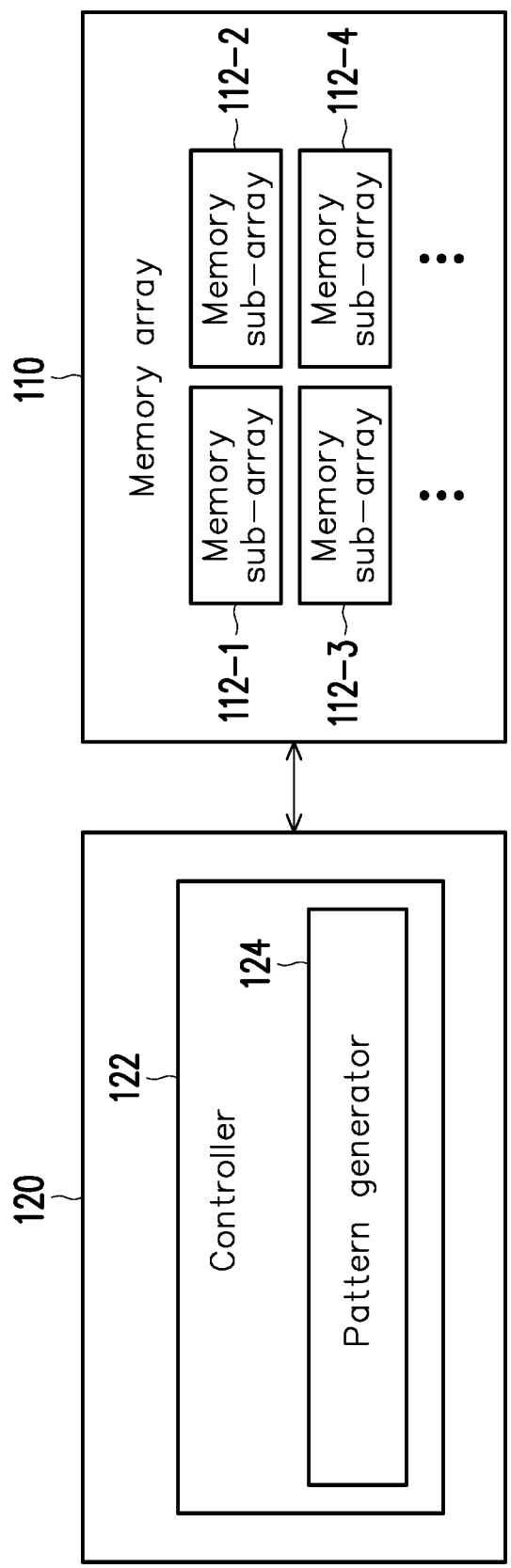
FIG. 1 illustrates a block diagram of a testing device for memory according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature on a second feature in the description that follows may include embodiments in which the first and second features are firmed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a testing device 100 for memory according to an embodiment of the disclosure. The testing device 100 for memory may be implemented as a memory device, a storage, or a consumer electronic devices with memory array.

The testing device 100 includes a memory array 110 and a test apparatus 120. The memory array 110 has a plurality of memory sub-arrays (i.e., memory sub-array 112-1 to memory sub-array 112-4). Each memory sub-arrays 112-1 to 112-4 includes a plurality of memory cells. In the embodiment, the type of the array 110 is MRAM, and each form of the memory sub-arrays 112-1 to 112-4 may be a memory block, a row of the memory array 110, a column of the memory array 110, or a combination thereof. The placement of memory sub-arrays 112-1 to 112-4 in the memory array 110 may be arranged coherently or arbitrarily. The application of this embodiment is not limited the type of the memory array 110 and the form of the memory sub-arrays 112-1 to 112-4. The test apparatus 120 is implemented as a built-in self-test (BIST) apparatus for the memory array 110.

The test apparatus 120 is coupled to the memory array 110, the test apparatus 120 detects hardware failure of the memory array 110 is occurred or not, and the test apparatus 120 reports a damage memory sub-array(s) or corresponding memory cell(s) if the hardware failure of the memory array 110 is occurred after detecting the hardware failure. And, if test apparatus 120 may further trim or repair these damaged memory cells according to the mechanisms with corresponding memory type (i.e., MRAM, ReRAM . . . etc.) of the memory array 110.

The test apparatus 120 includes a controller 122 and a pattern generator 124. The pattern generator 124 are set in the controller 122. The pattern generator 124 generate a background data, a first pattern data, and a second pattern data for testing the memory array 110. In some embodiments, the controller 122 may implements functions of the pattern generator 124 for generate the background data, the first pattern data, and the second pattern data, so as to implement the pattern generator 124. In some embodiments, the controller 122 may have a processor inside thereof for implementing the function of the pattern generator 124. The controller 122 may implement a method for detecting hardware failure in a memory device described in the embodiment of the disclosure.

The controller 122 sets up the background data to a to-be-tested memory sub-array of the memory sub-arrays 112-1 to 112-4, performs a first memory test operation with the to-be-tested memory sub-array according to the first pattern data for detecting whether the hardware failure of the to-be-tested memory sub-array is occurred during the first memory test operation. And, the controller 122 performs a second memory test operation with the to-be-tested memory sub-array according to the second pattern data for detecting whether the hardware failure of the to-be-tested memory sub-array is occurred during the second memory test operation in response to the hardware failure of the to-be-tested memory sub-array is not occurred during the first memory test operation. After detecting that the hardware failure of the to-be-tested memory sub-array is not occurred during the first memory test operation and the second memory test operation, data in the to-be-tested memory sub-array is the same as the background data. Thus, the controller 122 in the embodiment performs twice memory test operations (i.e., the first memory test operation and the second memory test operation) and designs the twice memory test operations and corresponding pattern data to expect that the data in the to-be-tested memory sub-array after performing the twice memory test operations is the same as the data in the to-be-tested memory sub-array before performing the twice memory test operations while the to-be-tested memory sub-array do not has hardware failure.

Figure 2:
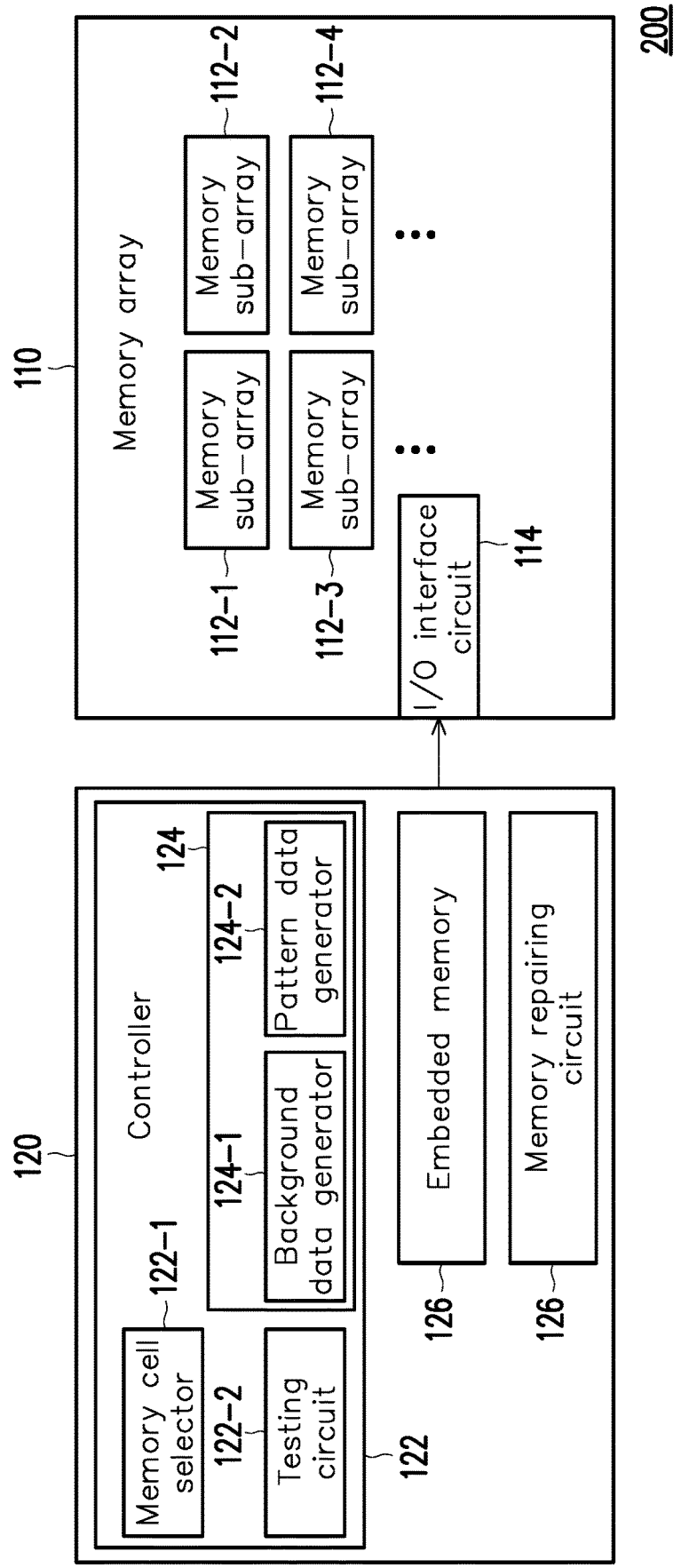
FIG. 2 illustrates a detailed block diagram of a testing device for memory according to an embodiment of the disclosure.

FIG. 2 illustrates a detailed block diagram of a testing device 200 for memory according to an embodiment of the disclosure. The main difference between the testing device 200 in FIG. 2 and the testing device 100 in FIG. 1 is that the pattern generator 124 of the testing device 200 further includes a background data generator 124-1 and pattern data generator 124-2, the controller 122 of the testing device 200 further includes a memory cell selector 122-1 and a testing circuit 122-2, the testing apparatus 120 of the testing device 200 further includes an embedded memory 126 and the memory repairing circuit 128, and the memory array 110 of the testing device 200 further includes an I/O interface circuit 114.

The background data generator 124-1 generates the background data for an to-be-tested memory sub-array, and the to-be-tested memory sub-array is one of the memory sub-arrays 112-1 to 112-4. In some embodiments, the background data may be the same as original data stored in the to-be-tested memory sub-array.

The pattern data generator 124-2 generates the first pattern data and the second pattern data. In some embodiments, the first pattern data is different from the second pattern data. It is because that the controller 122 performs twice memory test operations (i.e., the first memory test operation and the second memory test operation) and expects that the data in the to-be-tested memory sub-array after performing the twice memory test operations is the same as the data in the to-be-tested memory sub-array before performing the twice memory test operations while the to-be-tested memory sub-array do not has hardware failure. In other words, data in the to-be-tested memory sub-array before performing the twice memory test operations is the same as the background data set up by the controller 122.

In the embodiment, the controller 122 of the test apparatus 120 may test one memory cell in the to-be-tested memory sub-array each time. And, in some other embodiments, the controller 122 of the test apparatus 120 may test all memory cells in the to-be-tested memory sub-array at the same time by designed structures with parallel circuits. In the embodiment, the memory cell selector 122-1 coupled to the memory array 110 selects a testing memory cell in the to-be-tested memory sub-array of the memory array while performing the first memory test operation or the second memory test operation. The testing circuit 122-2 coupled to the memory cell 110 detects whether hardware failure of the testing memory cell in the to-be-tested memory sub-array is occurred while performing the first memory test operation or the second memory test operation.

The embedded memory 126 stores or temporality stores the first pattern data and the second pattern data. While the controller 122 preforms one of the memory test operations, it is needed to compare the data in the testing memory cell read by one of the memory test operations and the corresponding data in the first pattern data or the second pattern data, so as to generate the result of the memory test operations whether the data in the testing memory cell is the same as the corresponding data in the first pattern data or the second pattern data.

The memory repairing circuit 128 may do some mechanisms for trimming further repairing these damaged memory cells according to the result of the memory test operations presented that the hardware failure of the to-be-tested memory sub-array is occurred during the first memory test operation and the second memory test operation. In detail, according to the result of the memory test operations, the memory repairing circuit 128 knows the locations of the damaged memory cells, and uses repairing mechanisms for these damaged memory cells the repairing mechanisms may be different according to the types of non-volatile random-access memory, such as Magneto-resistive Random Access Memory (MRAM).

The I/O interface circuit 114 may include an address decoder(s), an write buffer(s), and an sense amplifier(s) for each memory sub-array 112-1 to 112-4, so as to perform a read operation, a write operation, a programming operation, and even an repairing operation for target memory cells of the memory sub-arrays 112-1 to 112-4 in the memory device 110. The controller 122, the testing circuit 122-2 and the memory repairing circuit 128 performs operations to the memory array 110 via the I/O interface circuit 114 accordingly.

In this embodiment, in order that the data (i.e., the background data) in the memory array 110 can maintain as original data after performing memory test operations, the test apparatus 120 performs at least twice memory test operations to change back the data in the memory array 110 while the memory array 110 do not has hardware failure.

Figure 3:
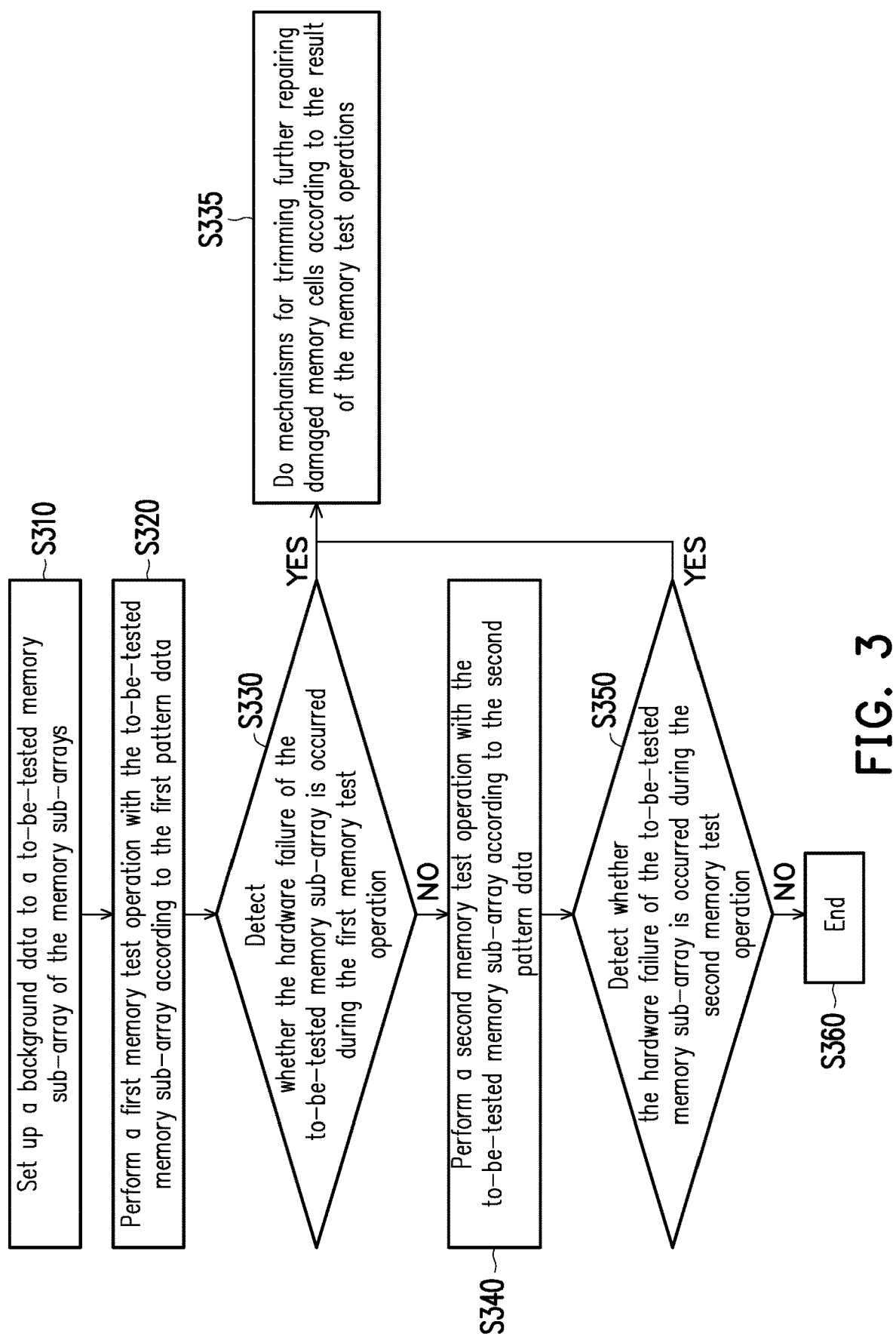
FIG. 3 illustrates a flowchart diagram illustrating a method for detecting hardware failure in a memory device according to an embodiment of the disclosure.

FIG. 3 illustrates a flowchart diagram illustrating a method 300 for detecting hardware failure in a memory device according to an embodiment of the disclosure. The method 300 may be performed by a testing device 100 for memory in FIG. 1, a testing device 200 for memory in FIG. 2 or a built-in self-test (BIST) apparatus (i.e., the testing apparatus 120 in FIG. 1 and FIG. 2). Take the testing device 100 for memory in FIG. 1 for implementing the method 300 as example in the embodiment.

In step S310, the controller 122 of the test apparatus 120 sets up the background data to a to-be-tested memory sub-array of the memory sub-arrays 112-1 to 112-4. In the embodiment, the original data in the to-be-tested memory sub-array is the same as the background data. In some embodiments, the controller 122 of the test apparatus 120 may need to read the to-be-tested memory sub-array of the memory array 110 for determining that what test modes of the memory test operation may be better.

In step S320, the controller 122 of the test apparatus 120 performs a first memory test operation with the to-be-tested memory sub-array according to the first pattern data for detecting whether the hardware failure of the to-be-tested memory sub-array is occurred during the first memory test operation. In step S330, the controller 122 detects whether the hardware failure of the to-be-tested memory sub-array is occurred during the first memory test operation.

If the step S330 is NO, then step 340 is performed from the step S330, the controller 122 of the test apparatus 120 performs a second memory test operation with the to-be-tested memory sub-array according to the second pattern data for detecting whether the hardware failure of the to-be-tested memory sub-array is occurred during the second memory test operation in response to the hardware failure of the to-be-tested memory sub-array is not occurred during the first memory test operation. Otherwise, if the step S330 is YES, it means the hardware failure of the to-be-tested memory sub-array is occurred during the first memory test operation, then step S335 is performed from the step S330, the controller 122 in FIG. 1 or the memory repairing circuit 128 in FIG. 2 does mechanisms for trimming further repairing these damaged memory cells according to the result of the memory test operations. The result of the memory test operations is presented that the hardware failure of the to-be-tested memory sub-array is occurred during the first memory test operation.

In step S350, the controller 122 detects whether the hardware failure of the to-be-tested memory sub-array is occurred during the second memory test operation. If the step S350 is NO, then step 360 is performed from the step S350, the controller 122 of the test apparatus 120 determines that the memory sub-arrays are all tested by the steps S320 to S350. If there is other memory sub-array(s) not been tested, the controller 122 selects one of not-tested memory sub-array(s) as the to-be-tested memory sub-array and performs the step S320, until the memory sub-arrays are all tested. If the step S350 is Yes, it means the hardware failure of the to-be-tested memory sub-array is occurred during the second memory test operation, then step S335 is performed from the step S350, the controller 122 in FIG. 1 or the memory repairing circuit 128 in FIG. 2 does mechanisms for trimming further repairing these damaged memory cells according to the result of the memory test operations. The result of the memory test operations is presented that the hardware failure of the to-be-tested memory sub-array is occurred during the second memory test operation.

Figure 4:
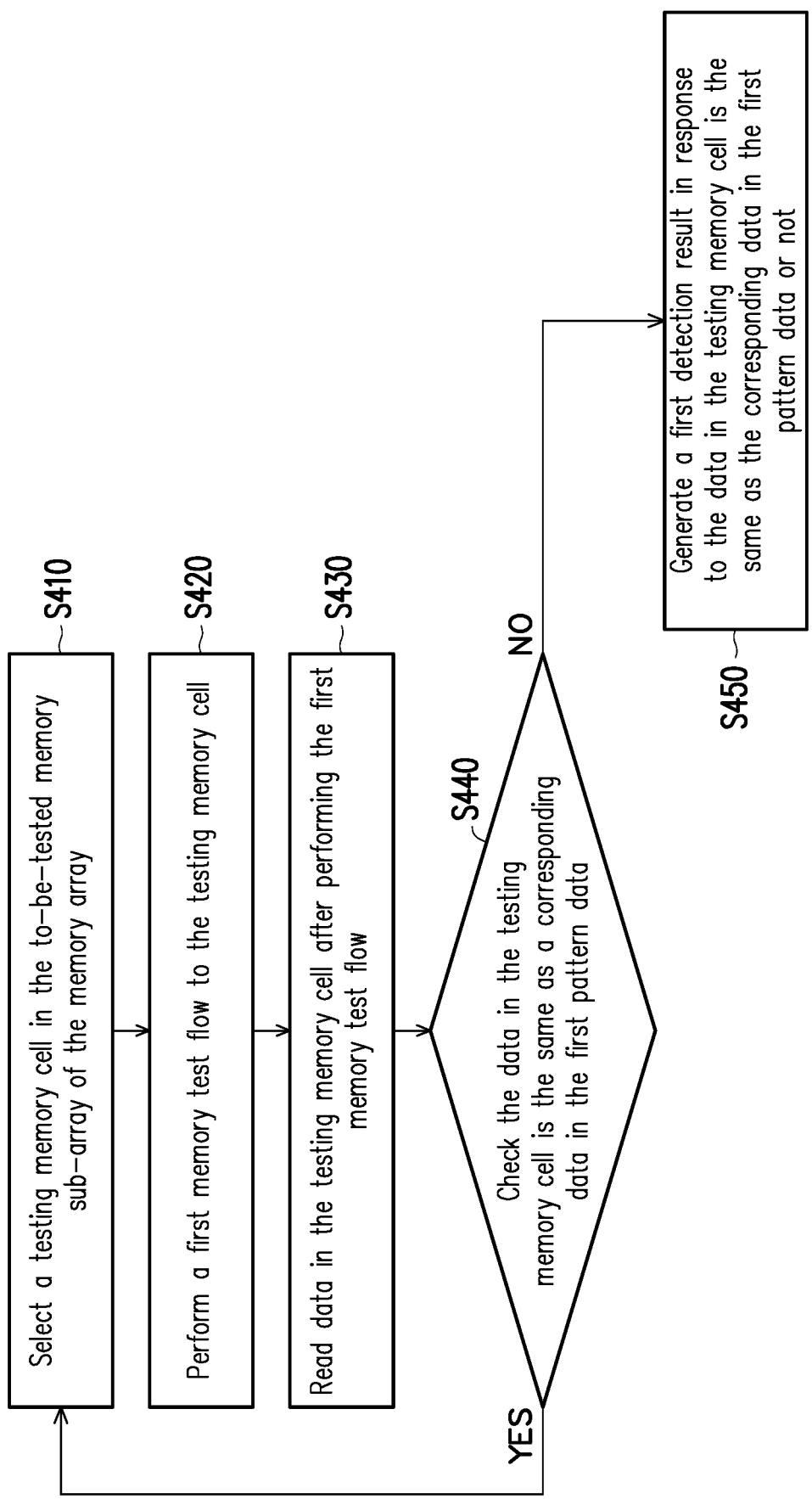
FIG. 4 illustrates a flowchart diagram illustrating detail steps of the step S330 in FIG. 3 according to an embodiment of the disclosure.

FIG. 4 illustrates a flowchart diagram illustrating detail steps of the step S330 in FIG. 3 according to an embodiment of the disclosure. In step S410, the controller 122 or the memory cell selector 122-1 in FIG. 2 selects a testing memory cell in the to-be-tested memory sub-array of the memory array while performing the first memory test operation. In step S420, the controller 122 or the testing circuit 122-2 in FIG. 2 performs a first memory test flow to the testing memory cell. The first memory test flow is dependent on the test modes implemented by the first memory test operation, and the embodiments described below will take some examples for people applying these embodiments as reference.

In step S430, the controller 122 in FIG. 1 or the testing circuit 122-2 in FIG. 2 reads data in the testing memory cell after performing the first memory test flow.

In step S440, the controller 122 in FIG. 1 or the testing circuit 122-2 in FIG. 2 checks the data in the testing memory cell is the same as a corresponding data in the first pattern data stored in the embedded memory 126 in FIG. 2.

If the step S440 is Yes, it means the data in the testing memory cell is the same as a corresponding data in the first pattern data and the hardware failure of the testing memory cell in the to-be-tested memory sub-array is not occurred, then step S410 is performed from the step S440, the controller 122 or the memory cell selector 122-1 in FIG. 2 selects a next testing memory cell in the to-be-tested memory sub-array of the memory array 110 for performing steps S420 to S440 until all memory cells in the to-be-tested memory sub-array are tested.

If the step S440 is No, it means the data in the testing memory cell is not the same as a corresponding data in the first pattern data and the hardware failure of the testing memory cell in the to-be-tested memory sub-array is occurred, then step S450 is performed from the step S440, the controller 122 or the memory cell selector 122-1 in FIG. 2 generates a first detection result in response to the data in the testing memory cell is the same as the corresponding data in the first pattern data or not in order to detect whether the hardware failure of the testing memory cell in the to-be-tested memory sub-array is occurred.

Figure 5:
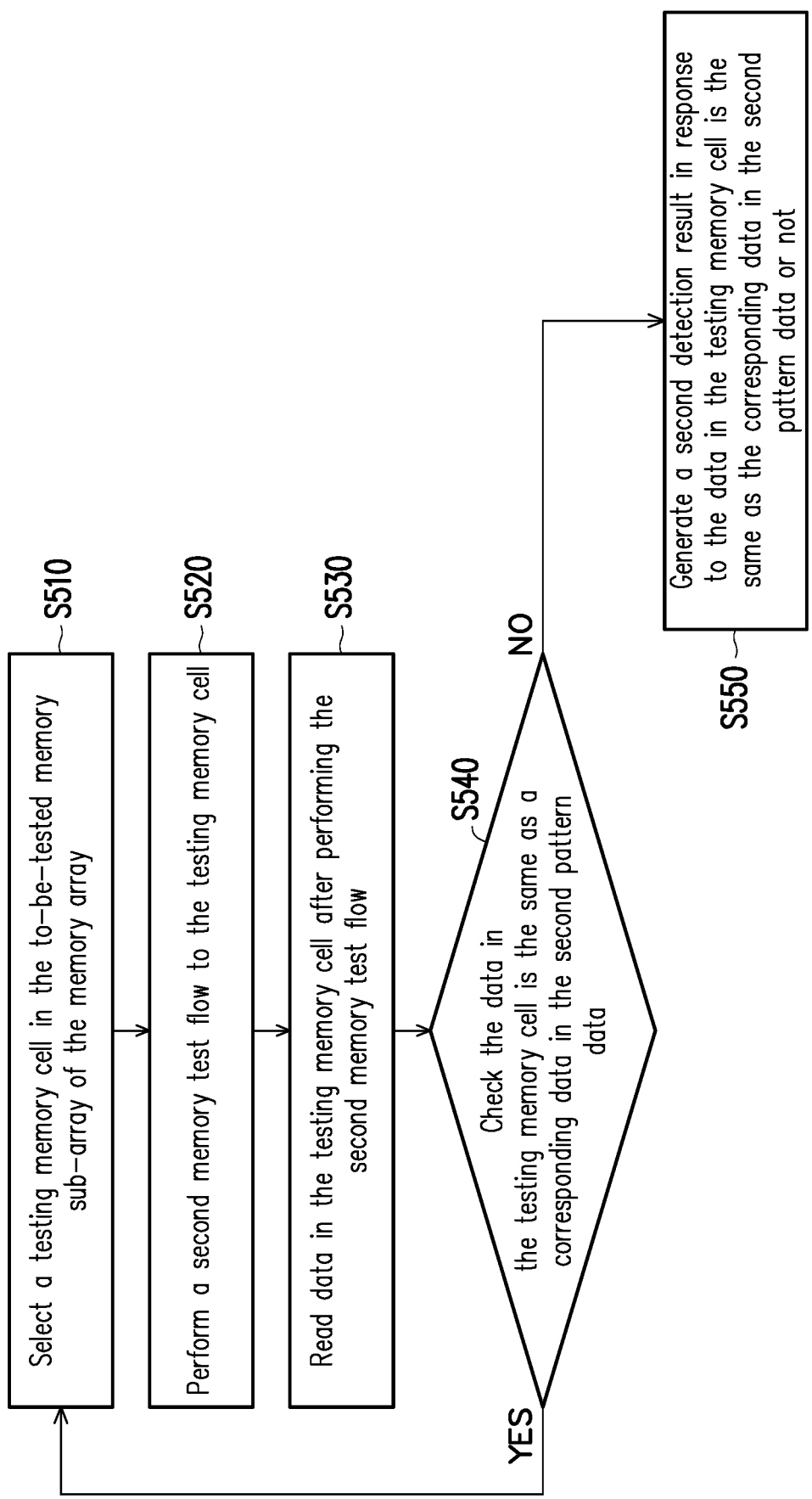
FIG. 5 illustrates a flowchart diagram illustrating detail steps of the step S35 in FIG. 3 according to an embodiment of the disclosure.

FIG. 5 illustrates a flowchart diagram illustrating detail steps of the step S35 in FIG. 3 according to an embodiment of the disclosure. In step S510, the controller 122 or the memory cell selector 122-1 in FIG. 2 selects a testing memory cell in the to-be-tested memory sub-array of the memory array while performing the second memory test operation. In step S520, the controller 122 or the testing circuit 122-2 in FIG. 2 performs a second memory test flow to the testing memory cell. The second memory test flow is dependent on the test modes implemented by the second memory test operation, and the embodiments described below will take some examples to show the test mode and the corresponding memory test flow for people applying these embodiments as reference.

In step S530, the controller 122 in FIG. 1 or the testing circuit 122-2 in FIG. 2 reads data in the testing memory cell after performing the second memory test flow.

In step S540, the controller 122 in FIG. 1 or the testing circuit 122-2 in FIG. 2 checks the data in the testing memory cell is the same as a corresponding data in the second pattern data stored in the embedded memory 126 in FIG. 2.

If the step S540 is Yes, it means the data in the testing memory cell is the same as a corresponding data in the second pattern data and the hardware failure of the testing memory cell in the to-be-tested memory sub-array is not occurred, then step S510 is performed from the step S540, the controller 122 or the memory cell selector 122-1 in FIG. 2 selects a next testing memory cell in the to-be-tested memory sub-array of the memory array 110 for performing steps S520 to S540 until all memory cells in the to-be-tested memory sub-array are tested.

If the step S540 is No, it means the data in the testing memory cell is not the same as a corresponding data in the second pattern data and the hardware failure of the testing memory cell in the to-be-tested memory sub-array is occurred, then step S550 is performed from the step S440, the controller 122 or the memory cell selector 122-1 in FIG. 2 generates a second detection result in response to the data in the testing memory cell is the same as the corresponding data in the second pattern data or not in order to detect whether the hardware failure of the testing memory cell in the to-be-tested memory sub-array is occurred.

Figure 6:
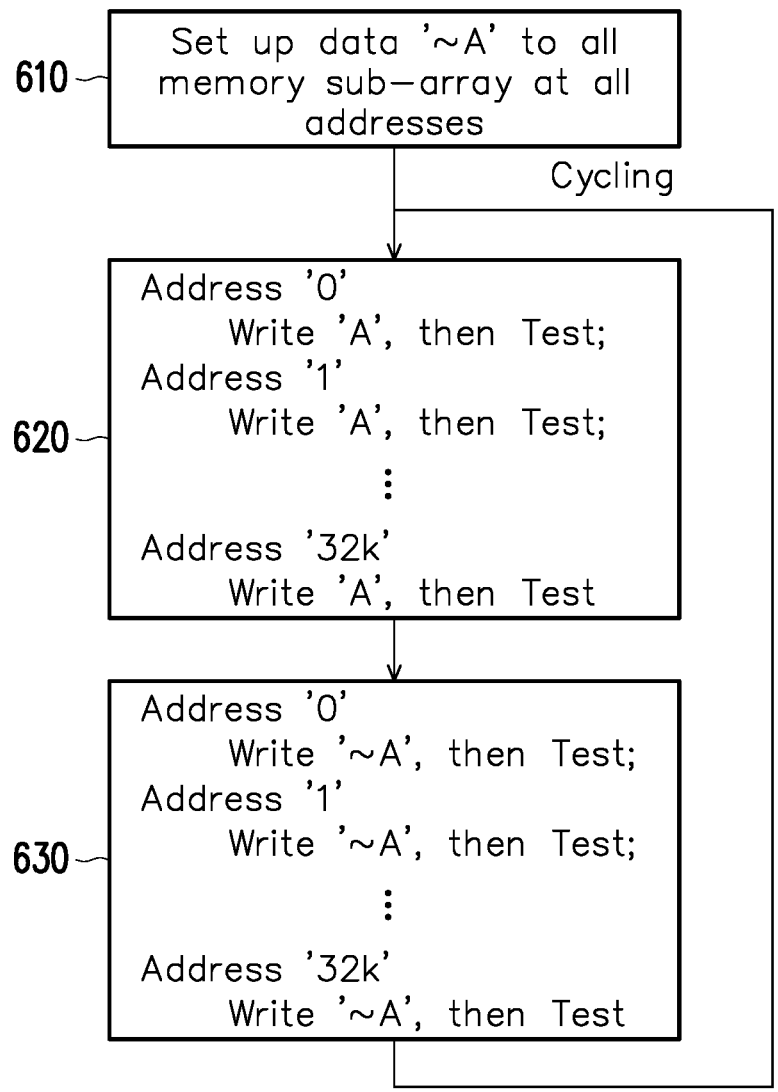
FIG. 6 illustrates a schematic diagram for one example to perform memory test operations in one memory sub-array according to an embodiment of the disclosure.

FIG. 6 illustrates a schematic diagram for one example to perform memory test operations in one memory sub-array according to an embodiment of the disclosure. In FIG. 6, in the situation that the memory sub-array has addresses from '0' to '32 k'. Block 610 is shown that the controller 122 sets up a background data (i.e., data '~A') to memory sub-arrays at all addresses. The data '~A' is presented as the inverted data of 'A'.

Block 620 is shown that the controller 122 firstly writes the data 'A' as the first memory test flow to the memory cell at address '0' of the memory sub-array and then performs the steps S430-S440 in FIG. 4 for testing the memory cell at address '0' of the memory sub-array has hardware failure or not. In Block 620, if the memory cell at address '0' of the memory sub-array does not has hardware failure, then the controller 122 secondly writes the data 'A' as the first memory test flow to the memory cell at address '1' of the memory sub-array, and then performs the steps S430-S440 for testing the memory cell at address '1' of the memory sub-array has hardware failure or not, until the memory cells at address '0' to '32 k' of the memory sub-array are been write and tested by performing the steps S430-S440 in FIG. 4. In other words, after the Block 620, all memory cells at address '0' to '32 k' of the memory sub-array have the data 'A' while no hardware failure detected in the Block 620.

Block 630 is shown that the controller 122 firstly writes the data '~A' as the second memory test flow to the memory cell at address '0' of the memory sub-array and then performs the steps S530-S540 in FIG. 5 for testing the memory cell at address '0' of the memory sub-array has hardware failure or not. In the Block 630, if the memory cell at address '0' of the memory sub-array does not has hardware failure, then the controller 122 secondly writes the data '~A' as the second memory test flow to the memory cell at address '1' of the memory sub-array, and then performs the steps S530-S540 in FIG. 5 for testing the memory cell at address '1' of the memory sub-array has hardware failure or not, until the memory cells at address '0' to '32 k' of the memory sub-array are been write and tested by performing the steps S530-S540 in FIG. 5. In other words, after the Block 630, all memory cells at address '0' to '32 k' of the memory sub-array have the data '~A', and the data in all memory cells at address '0' to '32 k' is the same as the background data while all memory cells do not have hardware failure. After the Block 630, if no hardware failure in the memory sub-array is detected, the controller 120 select another memory sub-array as the to-be-tested memory sub-array and performs the Block 620 for cycling to test the memory sub-arrays in the memory array 110. All memory cells at address '0' to '32 k' of the memory sub-array have the data '~A' after the Block 630.

Figure 7:
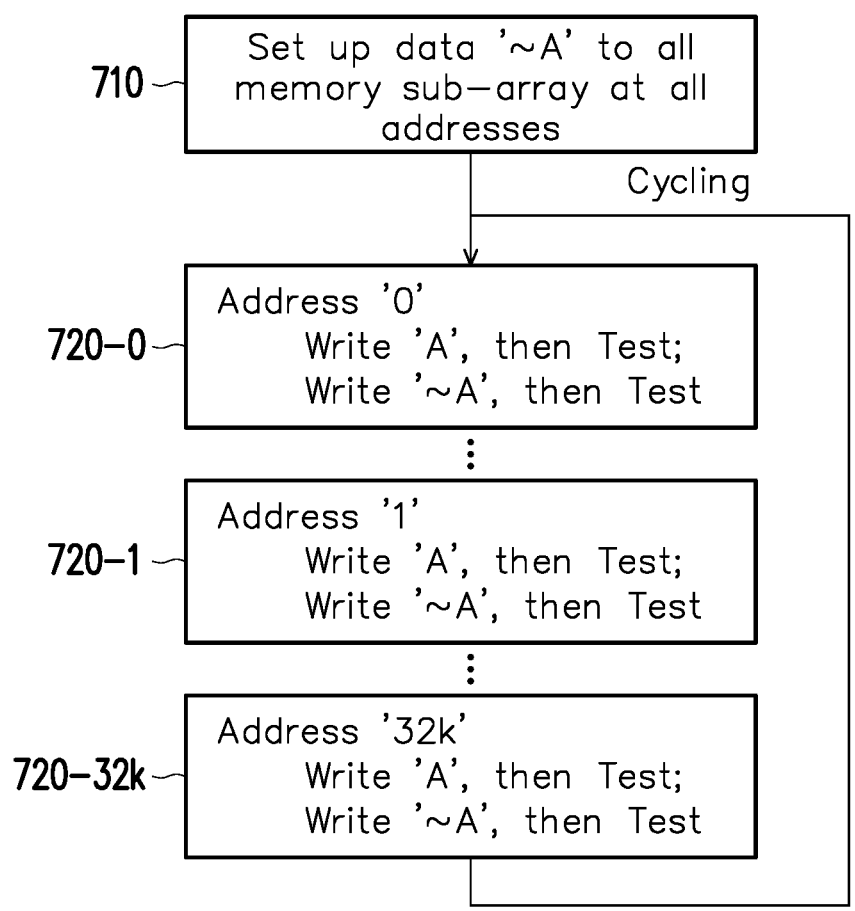
FIG. 7 illustrates a schematic diagram for another example to perform memory test operations in one memory sub-array according to an embodiment of the disclosure.

FIG. 7 illustrates a schematic diagram for another example to perform memory test operations in one memory sub-array according to an embodiment of the disclosure. In FIG. 7, in the situation that the memory sub-array has addresses from '0' to '32 k'. Block 710 is shown that the controller 122 sets-up a background data (i.e., data '~A') to all memory sub-arrays.

Block 720-0 is shown that the controller 122 firstly writes the data 'A' as the first memory test flow to the memory cell at address '0' of the memory sub-array and then performs the steps S430-S440 in FIG. 4 for testing the memory cell at address '0' of the memory sub-array has hardware failure or not. In Block 720-0, if the memory cell at address '0' of the memory sub-array does not has hardware failure, then the controller 122 secondly writes the data '~A' as the second memory test flow to the memory cell at address '0' of the memory sub-array, and then performs the steps S530-S540 in FIG. 5 for testing the memory cell at address '0' of the memory sub-array has hardware failure or not. The Block 720-2 is shown that the controller 122 writes the data 'A' as the first memory test flow to the memory cell at address '1' of the memory sub-array and then performs the steps S430-S440 in FIG. 4 for testing the memory cell at address '0' of the memory sub-array has hardware failure or not. In Block 720-2, if the memory cell at address '1' of the memory sub-array does not has hardware failure, then the controller 122 secondly writes the data '~A' as the second memory test flow to the memory cell at address '1' of the memory sub-array, and then performs the steps S530-S540 in FIG. 5 for testing the memory cell at address '1' of the memory sub-array has hardware failure or not. And so on, the Block 720-2 to 720-32$k$ is that the controller 122 performs the first memory test operation and then performs the second memory test operation for testing the memory cell at addresses '2' to '32 k' of the memory sub-array sequentially. After Block 720-32$k$, if no hardware failure in the memory sub-array is detected, the controller 120 select another memory sub-array as the to-be-tested memory sub-array and performs the Block 720 for cycling to test the memory sub-arrays in the memory array 110. All memory cells at address '0' to '32 k' of the memory sub-array have the data '~A' after the Block 720-32$k$.

The test mode, the first/second pattern data and the first/second memory test flow are described below for taking examples to implement the first/second memory test operations. Table I takes some examples for the test modes. These test modes may be selected by the controller 122 for implementing as the memory test operations. In some embodiments, the controller 122 may randomly select one of the test modes to implement the memory test operations, sequentially select one of the test modes to implement the memory test operations, or select a target test mode among these test modes by the predetermine input data form users. How to select the test modes as the memory test operations is depend on the need for people applying the embodiments, and may not limited thereof.

TABLE I

| Test mode | Background/pattern data | Memory test flow |
| --- | --- | --- |
| 1: RER | Background: Not set; $1^{st}$ pattern: '0'; $2^{nd}$ pattern: '1' | Not set Background; Write $1^{st}$ pattern('0'), then Test; Write $2^{nd}$ pattern('1'), then Test. |
| 2: WER | Background: all '0/1'; $1^{st}$ pattern: '1'; $2^{nd}$ pattern: '0'. | Set Background "0", write $1^{st}$ pattern('1'), then Test; Set Background "1", write $2^{nd}$ pattern('0'), then Test. |
| 3: RDR | Background: all '0'; $1^{st}$ pattern: '1'; $2^{nd}$ pattern: '0' | Set Background "0", write $1^{st}$ pattern('1'), Read for N times, then Test; Write $2^{nd}$ pattern('0'), Read for N times, then Test. |
| 4: RET | Background: all '1'; $1^{st}$ pattern: '0'; $2^{nd}$ pattern: '1'. | Set Background "1", write $1^{st}$ pattern('0'), then Test for Read in 1 minute; Write $2^{nd}$ pattern('1'), then Test for Read in 1 minute. |
| 5: Endurance | Background: all '0'; $1^{st}$ pattern: '1'; $2^{nd}$ pattern: '0'. | Set Background "0", write $1^{st}$ pattern('1') for N times, then Test; Write $2^{nd}$ pattern('0'), for N times, then Test. |

TABLE I-continued

| Test mode | Background/pattern data | Memory test flow |
| --- | --- | --- |
| 6: Breakdown | Background: all '0'; $1^{st}$ pattern: '1'; $2^{nd}$ pattern: '0'. | Set Background "0", write $1^{st}$ pattern('1') by voltage stress, then Test; Write $2^{nd}$ pattern('0') by voltage stress, then Test. |

Table I shows 6 test modes for implementing the first/second memory test operations, such as test mode 1 'RER', test mode 2 'WER', test mode 3 'RDR', test mode 4 'RET', test mode 5 'Endurance' and test mode 6 'Breakdown'.

In the situation that taking the test mode 1 'RER' as the first/second memory test operations, the background data may not be set, in other words, the background data may be unknown; the first memory test flow 'Write $1^{st}$ pattern ('0'), then Test' is shown to write the first pattern data '0' to the testing memory cell or the to-be-tested memory sub-array, then do the steps S430-S440 in FIG. 4 for testing the testing memory cell; the second memory test flow 'Write $2^{nd}$ pattern ('1'), then Test' is shown to write the second pattern data '1' to the testing memory cell or the to-be-tested memory sub-array, then do the steps S530-S540 in FIG. 5 for testing the testing memory cell.

In the situation that taking the test mode 2 'WER' as the first/second memory test operations, the background data is set up all '0/1' to the testing memory cell or the to-be-tested memory sub-array; the first memory test flow 'Set Background "0", write $1^{st}$ pattern ('1'), then Test;' is shown to set up background data '0' to the testing memory cell or the to-be-tested memory sub-array, and then to write the first pattern data '1' to the testing memory cell or the to-be-tested memory sub-array, further to do the steps S430-S440 in FIG. 4 for testing the testing memory cell; the second memory test flow 'Set Background "1", write $2^{nd}$ pattern ('0'), then Test' is shown to set up background data '1' to the testing memory cell or the to-be-tested memory sub-array, and then to write the second pattern data '0' to the testing memory cell or the to-be-tested memory sub-array, further to do the steps S530-S540 in FIG. 5 for testing the testing memory cell.

In the situation that taking the test mode 3 'RDR' as the first/second memory test operations, the background data is set up all '0' to the testing memory cell or the to-be-tested memory sub-array; the first memory test flow 'write $1^{st}$ pattern ('1'), Read for N times, then Test;' is shown to write the first pattern data '1' to the testing memory cell or the to-be-tested memory sub-array, read the testing memory cell or the to-be-tested memory sub-array repeatedly for N times (N is a positive integer), further to do the steps S430-S440 in FIG. 4 for testing the testing memory cell; the second memory test flow 'Write $2^{nd}$ pattern ('0'), Read for N times, then Test' is shown to write the second pattern data '0' to the testing memory cell or the to-be-tested memory sub-array, read the testing memory cell or the to-be-tested memory sub-array repeatedly for N times (N is a positive integer), further to do the steps S530-S540 in FIG. 5 for testing the testing memory cell.

In the situation that taking the test mode 4 'RET' as the first/second memory test operations, the background data is set up all '1' to the testing memory cell or the to-be-tested memory sub-array; the first memory test flow 'write $1^{st}$ pattern ('0'), then Test for Read in 1 minute' is shown to write the first pattern data '1' to the testing memory cell or the to-be-tested memory sub-array, then to do the steps S430-S440 of FIG. 4 in one minute for testing the testing memory cell; the second memory test flow 'Write $2^{nd}$ pattern ('1'), then Test for Read in 1 minute' is shown to write the second pattern data '1' to the testing memory cell or the to-be-tested memory sub-array, then to do the steps S530-S540 of FIG. 5 in one minute for testing the testing memory cell.

In the situation that taking the test mode 5 'Endurance' as the first/second memory test operations, the background data is set up all '0' to the testing memory cell or the to-be-tested memory sub-array; the first memory test flow 'write $1^{st}$ pattern ('1') for N times, then Test' is shown to write the first pattern data '1' to the testing memory cell or the to-be-tested memory sub-array for N times, then to do the steps S430-S440 of FIG. 4 for testing the testing memory cell; the second memory test flow 'Write $2^{nd}$ pattern ('0'), for N times, then Test' is shown to write the second pattern data '0' to the testing memory cell or the to-be-tested memory sub-array for N times, then to do the steps S530-S540 of FIG. 5 for testing the testing memory cell.

In the situation that taking the test mode 5 'Breakdown' as the first/second memory test operations, the background data is set up all '0' to the testing memory cell or the to-be-tested memory sub-array; the first memory test flow 'write $1^{st}$ pattern ('1') by voltage stress, then Test' is shown to write the first pattern data '1' to the testing memory cell or the to-be-tested memory sub-array for larger voltage stress, then to do the steps S430-S440 of FIG. 4 for testing the testing memory cell; the second memory test flow 'Write $2^{nd}$ pattern ('0'), for N times, then Test' is shown to write the second pattern data '0' to the testing memory cell or the to-be-tested memory sub-array for larger voltage stress, then to do the steps S530-S540 of FIG. 5 for testing the testing memory cell.

In summary, the test apparatus and the method for detecting hardware failure in the memory device in the embodiments performs twice or more memory test operations (i.e., the first memory test operation and the second memory test operation) and designs the twice or more memory test operations and corresponding pattern data to expect that the data in the to-be-tested memory sub-array after performing the twice memory test operations is the same as the data in the to-be-tested memory sub-array before performing the twice memory test operations while the to-be-tested memory sub-array do not has hardware failure. Such that, after performing the memory test operations of the memory array, it may no need to change back the data in the memory array in the embodiments.

According to some embodiments, a testing device for memory is provided. The testing device for memory includes a memory array and a test apparatus. The memory array has a plurality of memory sub-arrays. The test apparatus is coupled to the memory array and configured to detecting hardware failure of the memory array, The test apparatus includes a controller and a pattern generator. The pattern generator sets in the controller and configured to generate a background data, a first pattern data, and a second pattern data, The controller sets up the background data to a to-be-tested memory sub-array of the memory sub-arrays, performs a first memory test operation with the to-be-tested memory sub-array according to the first pattern data for detecting whether the hardware failure of the to-be-tested memory sub-array is occurred during the first memory test operation. The controller performs a second memory test operation with the to-be-tested memory sub-array according to the second pattern data for detecting whether the hardware failure of the to-be-tested memory sub-array is occurred during the second memory test operation in response to the hardware failure of the to-be-tested memory sub-array is not occurred during the first memory test operation. After detecting that the hardware failure of the to-be-tested memory sub-array is not occurred during the first memory test operation and the second memory test operation, data in the to-be-tested memory sub-array is the same as the background data. According to some embodiments, the test apparatus is a built-in self-test (BIST) apparatus. According to some embodiments, a type of the memory array is MRAM. According to some embodiments, the first pattern data is different from the second pattern data. According to some embodiments, the second pattern data is the same as the background data. According to some embodiments, the pattern generator includes a background data generator and a pattern data generator. The background data generator is configured to generating the background data. The pattern data generator is configured to generating the first pattern data and the second pattern data, According to some embodiments, the controller further includes a memory cell selector and a testing circuit. The memory cell selector is coupled to the memory cell and selects a testing memory cell in the to-be-tested memory sub-array of the memory array while performing the first memory test operation or the second memory test operation. The testing circuit is coupled to the memory cell and detects whether hardware failure of the testing memory cell in the to-be-tested memory sub-array is occurred while performing the first memory test operation or the second memory test operation. According to some embodiments, the step for performing the first memory test operation includes following. The testing circuit performs a first memory test flow to the testing memory cell. The testing circuit reads data in the testing memory cell after performing the first memory test flow. The testing circuit checks the data in the testing memory cell is the same as a corresponding data in the first pattern data. The testing circuit generates a first detection result in response to the data in the testing memory cell is the same as the corresponding data in the first pattern data or not in order to detect whether the hardware failure of the testing memory cell in the to-be-tested memory sub-array is occurred. According to some embodiments, while the first detection result is presented that the hardware failure of the testing memory cell in the to-be-tested memory sub-array is occurred, the testing circuit do not perform the second memory test operation. While the first detection result is presented that the hardware failure of the testing memory cell in the to-be-tested memory sub-array is not occurred, the testing circuit perform the second memory test operation after the first memory test operation is performed. According to some embodiments, the step to perform the second memory test operation includes following. The testing circuit performs a second memory test flow to the testing memory cell. The testing circuit reads data in the testing memory cell after performing the second memory test flow. The testing circuit checks the data in the testing memory cell is the same as a corresponding data in the second pattern data. The testing circuit generates a second detection result in response to the data in the testing memory cell is the same as the corresponding data in the second pattern data or not in order to detect whether the hardware failure of the testing memory cell in the to-be-tested memory sub-array is occurred.

According to some embodiments, a method for detecting hardware failure in a memory device is provided. The memory device includes a memory array having a plurality of memory sub-arrays. The method includes following steps. Setting up a background data to a to-be-tested memory sub-array of the memory sub-arrays. Performing a first memory test operation with the to-be-tested memory sub-array according to the first pattern data for detecting whether the hardware failure of the to-be-tested memory sub-array is occurred during the first memory test operation. And, performing a second memory test operation with the to-be-tested memory sub-array according to the second pattern data for detecting whether the hardware failure of the to-be-tested memory sub-array is occurred during the second memory test operation in response to the hardware failure of the to-be-tested memory sub-array is not occurred during the first memory test operation, wherein, after detecting that the hardware failure of the to-be-tested memory sub-array is not occurred during the first memory test operation and the second memory test operation, data in the to-be-tested memory sub-array is the same as the background data. According to some embodiments, the method is performed by a built-in self-test (BIST) apparatus. According to some embodiments, a type of memory array is MRAM. According to some embodiments, the first pattern data is different from the second pattern data, and the second pattern data is the same as the background data. According to some embodiments, the method further includes following steps. Selecting a testing memory cell in the to-be-tested memory sub-array of the memory array while performing the first memory test operation or the second memory test operation. And, detecting whether hardware failure of the testing memory cell in the to-be-tested memory sub-array is occurred while performing the first memory test operation or the second memory test operation. According to some embodiments, the step for performing the first memory test operation includes following steps. Performing a first memory test flow to the testing memory cell, Reading data in the testing memory cell after performing the first memory test flow. Checking the data in the testing memory cell is the same as a corresponding data in the first pattern data. And, generating a first detection result in response to the data in the testing memory cell is the same as the corresponding data in the first pattern data or not in order to detect whether the hardware failure of the testing memory cell in the to-be-tested memory sub-array is occurred. According to some embodiments, the method further includes following steps. Not performing the second memory test operation in response to the first detection result is presented that the hardware failure of the testing memory cell in the to-be-tested memory sub-array is occurred. And, performing the second memory test operation after the first memory test operation is performed in response to the first detection result is presented that the hardware failure of the testing memory cell in the to-be-tested memory sub-array is not occurred. According to some embodiments, the step for performing the second memory test operation includes following steps. Performing a second memory test flow to the testing memory cell. Reading data in the testing memory cell after performing the second memory test flow. Checking the data in the testing memory cell is the same as a corresponding data in the second pattern data. And, generating a second detection result in response to the data in the testing memory cell is the same as the corresponding data in the second pattern data or not in order to detect whether the hardware failure of the testing memory cell in the to-be-tested memory sub-array is occurred.

According to some embodiments, a test apparatus for a memory array is provided. The memory array includes a plurality of memory sub-arrays. The test apparatus includes a controller and pattern generator. The pattern generator sets in the controller and generates a background data, a first pattern data, and a second pattern data. The controller sets up the background data to a to-be-tested memory sub-array of the memory sub-arrays, performs a first memory test operation with the to-be-tested memory sub-array according to the first pattern data for detecting whether the hardware failure of the to-be-tested memory sub-array is occurred during the first memory test operation. The controller performs a second memory test operation with the to-be-tested memory sub-array according to the second pattern data for detecting whether the hardware failure of the to-be-tested memory sub-array is occurred during the second memory test operation in response to the hardware failure of the to-be-tested memory sub-array is not occurred during the first memory test operation. After detecting that the hardware failure of the to-be-tested memory sub-array is not occurred during the first memory test operation and the second memory test operation, data in the to-be-tested memory sub-array is the same as the background data. According to some embodiments, the test apparatus is a BIST apparatus.

The fore has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that ay make various changes, substitutions and alterations herein without departing from the spirit and scope of the present disclosure.

What is claimed is:

1. A testing device for memory, comprising:
   a memory array, has a plurality of memory sub-arrays; and
   a test apparatus, coupled to the memory array, configured to detect an occurrence of hardware failure in the memory array,
   wherein the test apparatus comprising:
      a controller; and
      a pattern generator, set in the controller, configured to generate a background data, a first pattern data, and a second pattern data, wherein the first pattern data is different from the background data,
      wherein the controller sets up the background data to a to-be-tested memory sub-array of the memory sub-arrays, writes the first pattern data to the to-be-tested memory sub-array of the memory sub-arrays after setting up the background data to the to-be-tested memory sub-array, performs a first memory test operation with the to-be-tested memory sub-array according to the first pattern data for detecting the occurrence of the hardware failure in the to-be-tested memory sub-array during the first memory test operation, wherein
      wherein the controller writes the second pattern data to the to-be-tested memory sub-array of the memory sub-arrays, and performs a second memory test operation with the to-be-tested memory sub-array according to the second pattern data for detecting the occurrence of the hardware failure in the to-be-tested memory sub-array during the second memory test operation in response to detecting that the hardware failure does not occur in the to-be-tested memory sub-array during the first memory test operation,
      wherein, in response to determining that data in the to-be-tested memory sub-array is the same as the background data after performing the first memory test operation and the second memory test operation, the controller determines that the hardware failure does not occur in the to-be-tested memory sub-array, wherein the second pattern data is same as the background data.

2. The testing device for memory according to claim 1, wherein the test apparatus is a built-in self-test (BIST) apparatus.

3. The testing device for memory according to claim 1, wherein a type of the memory array is MRAM.

4. The testing device for memory according to claim 1, wherein the first pattern data is inverted data of the second pattern data.

5. The testing device for memory according to claim 1, wherein the pattern generator comprising:
   a background data generator, configured to generating the background data, and
   a pattern data generator, configured to generating the first pattern data and the second pattern data.

6. The testing device for memory according to claim 1, wherein the controller further comprising:
   a memory cell selector, coupled to the memory cell, configured to select a testing memory cell in the to-be-tested memory sub-array of the memory array while performing the first memory test operation or the second memory test operation; and
   a testing circuit, coupled to the memory cell, configured to detect the occurrence of the hardware failure in the testing memory cell of the to-be-tested memory sub-array during the first memory test operation or the second memory test operation.

7. The testing device for memory according to claim 6, wherein during the first memory test operation, the testing circuit is configured to:
   perform a first memory test flow to the testing memory cell,
   read first data in the testing memory cell after performing the first memory test flow,
   check whether the first data in the testing memory cell is the same as a corresponding data in the first pattern data, and,
   generate a first detection result in response to the first data in the testing memory cell is the same as the corresponding data in the first pattern data or not, wherein the first detection result indicates the occurrence of the hardware failure in the testing memory cell of the to-be-tested memory sub-array.

8. The testing device for memory according to claim 7, wherein
   when the first detection result indicates that the hardware failure occurs in the testing memory cell of the to-be-tested memory sub-array, the testing circuit does not perform the second memory test operation, and,
   when the first detection result indicates that the hardware failure does not occur in the testing memory cell of the to-be-tested memory sub-array, the testing circuit performs the second memory test operation after the first memory test operation is performed.

9. The testing device for memory according to claim 8, wherein during the second memory test operation, the testing circuit is configured to:
perform a second memory test flow to the testing memory cell,
read second data in the testing memory cell after performing the second memory test flow,
check whether the second data in the testing memory cell is the same as a corresponding data in the second pattern data, and,
generate a second detection result in response to the second data in the testing memory cell is the same as the corresponding data in the second pattern data or not, wherein the second detection result indicates the occurrence of the hardware failure in the testing memory cell of the to-be-tested memory sub-array.

10. A method for detecting hardware failure in a memory device, wherein the memory device includes a memory array having a plurality of memory sub-arrays,
wherein the method comprising:
setting up a background data to a to-be-tested memory sub-array of the memory sub-arrays;
writing a first pattern data to the to-be-tested memory sub-array of the memory sub-arrays after setting up the background data to the to-be-tested memory sub-array;
performing a first memory test operation with the to-be-tested memory sub-array according to the first pattern data for detecting an occurrence of the hardware failure in the to-be-tested memory sub-array during the first memory test operation, wherein the first pattern data is different from the background data;
writing a second pattern data to the to-be-tested memory sub-array of the memory sub-arrays; and
performing a second memory test operation with the to-be-tested memory sub-array according to the second pattern data for detecting the occurrence of the hardware failure in the to-be-tested memory sub-array during the second memory test operation in response to detecting that the hardware failure does not occur in the to-be-tested memory sub-array during the first memory test operation,
wherein, in response to determining that data in the to-be-tested memory sub-array is the same as the background data after performing the first memory test operation and the second memory test operation, the hardware failure does not occur in the to-be-tested memory sub-array, wherein the second pattern data is same as the background data.

11. The method according to claim 10, wherein the method is performed by a built-in self-test (BIST) apparatus.

12. The method according to claim 10, wherein a type of memory array is MRAM.

13. The method according to claim 10, wherein the first pattern data is inverted data of the second pattern data.

14. The method according to claim 10, further comprising:
selecting a testing memory cell in the to-be-tested memory sub-array of the memory array while performing the first memory test operation or the second memory test operation; and
detecting the occurrence of the hardware failure in the testing memory cell of the to-be-tested memory sub-array during the first memory test operation or the second memory test operation.

15. The method according to claim 14, performing the first memory test operation comprising:
performing a first memory test flow to the testing memory cell;
reading first data in the testing memory cell after performing the first memory test flow;
checking whether the first data in the testing memory cell is the same as a corresponding data in the first pattern data; and
generating a first detection result in response to the first data in the testing memory cell is the same as the corresponding data in the first pattern data or not, wherein the first detection result indicates the occurrence of the hardware failure in the testing memory cell of the to-be-tested memory sub-array.

16. The method according to claim 15, further comprising:
not performing the second memory test operation in response to the first detection result indicates that the hardware failure occurs in the testing memory cell of the to-be-tested memory sub-array; and
performing the second memory test operation after the first memory test operation is performed in response to the first detection result indicates that the hardware failure does not occur in the testing memory cell of the to-be-tested memory sub-array.

17. The method according to claim 16, the step for performing the second memory test operation comprising:
performing a second memory test flow to the testing memory cell;
reading second data in the testing memory cell after performing the second memory test flow;
checking whether the second data in the testing memory cell is the same as a corresponding data in the second pattern data; and
generating a second detection result in response to the second data in the testing memory cell is the same as the corresponding data in the second pattern data or not, wherein the second detection result indicates the occurrence of the hardware failure in the testing memory cell of the to-be-tested memory sub-array.

18. A test apparatus for a memory array, wherein the memory array includes a plurality of memory sub-arrays,
wherein the test apparatus comprising:
a controller; and
a pattern generator, set in the controller, configured to generate a background data, a first pattern data, and a second pattern data, wherein the first pattern data is different from the background data,
wherein the controller sets up the background data to a to-be-tested memory sub-array of the memory sub-arrays, writes the first pattern data to the to-be-tested memory sub-array of the memory sub-arrays after setting up the background data to the to-be-tested memory sub-array, performs a first memory test operation with the to-be-tested memory sub-array according to the first pattern data for detecting an occurrence of the hardware failure in the to-be-tested memory sub-array during the first memory test operation,
wherein the controller writes the second pattern data to the to-be-tested memory sub-array of the memory sub-arrays, and performs a second memory test operation with the to-be-tested memory sub-array according to the second pattern data for detecting the occurrence of the hardware failure in the to-be-tested memory sub-array during the second memory test operation in response detecting that to the hardware failure does not occur in the to-be-tested memory sub-array during the first memory test operation, wherein, in response to determining that data in the to-be-tested memory sub-array is the same as the background data after performing the first memory test operation and the second memory test operation, the controller determines that that the hardware failure does not occur in the to-be-tested memory sub-array, wherein the second pattern data is same as the background data.

19. The test apparatus according to claim 18, wherein the test apparatus is a built-in self-test (BIST) apparatus.

20. The testing apparatus according to claim 18, wherein the controller further comprising:

a memory cell selector, configured to select a testing memory cell in the to-be-tested memory sub-array of the memory array for the first memory test operation or the second memory test operation; and a testing circuit, configured to detect the occurrence of the hardware failure in the testing memory cell of the to-be-tested memory sub-array during the first memory test operation or the second memory test operation.

* * * * *